(12) United States Patent
Mullins

(10) Patent No.: US 7,113,607 B1
(45) Date of Patent: Sep. 26, 2006

(54) LOW FREQUENCY FEEDBACK CONTROLLED AUDIO SYSTEM

(76) Inventor: Joe H. Mullins, 350 White Oak Dr. NE., Albuquerque, NM (US) 87122-1411

( * ) Notice: Subject to any disclaimer, the term of this patent is extended or adjusted under 35 U.S.C. 154(b) by 0 days.

(21) Appl. No.: 09/389,085

(22) Filed: Sep. 2, 1999

Related U.S. Application Data

(60) Provisional application No. 60/098,998, filed on Sep. 3, 1998.

(51) Int. Cl.
   *H04R 3/00*   (2006.01)
   *H04R 29/00*  (2006.01)
   *H03G 5/00*   (2006.01)

(52) U.S. Cl. .................... 381/96; 381/58; 381/59; 381/103; 381/98

(58) Field of Classification Search ............. 381/96, 381/59, 58, 150, 116, 117, 361, 341, 335, 381/182, 186
See application file for complete search history.

(56) References Cited

U.S. PATENT DOCUMENTS

| | | |
|---|---|---|
| 3,798,374 A | 3/1974 | Meyers |
| 3,821,473 A | 6/1974 | Mullins |
| 4,180,706 A | 12/1979 | Bakgaard |
| 4,332,986 A | 6/1982 | Butler |
| 4,550,430 A | 10/1985 | Meyers |
| 5,031,221 A | 7/1991 | Yokoyama |
| 5,086,473 A | 2/1992 | Erath |
| 5,257,316 A * | 10/1993 | Takeyama et al. ............ 381/71 |
| 5,327,504 A * | 7/1994 | Hobelsberger ............... 381/96 |
| 5,461,676 A * | 10/1995 | Hobelsberger ............... 381/96 |
| 5,588,065 A * | 12/1996 | Tanaka et al. ............... 381/96 |
| 5,689,574 A * | 11/1997 | Heirich et al. ............. 381/354 |
| 5,693,917 A * | 12/1997 | Bertagni et al. ............ 181/173 |
| 5,748,753 A * | 5/1998 | Carver ........................ 381/96 |
| 5,771,304 A * | 6/1998 | Van Den Thillart et al. .. 381/24 |
| 5,812,686 A * | 9/1998 | Hobelsberger ............... 381/96 |
| 5,847,333 A * | 12/1998 | D'Hoogh ................... 181/171 |
| 6,031,919 A * | 2/2000 | Funahashi et al. .......... 381/150 |

OTHER PUBLICATIONS

Keele, D. B., Jr., "Low-Frequency Loudspeaker Assessment by Nearfield Sound-Pressure Measurement", *J. Audio Eng.*, Soc. 22, 154-162, Apr. 1974.

Mullins, J. H., "A low-frequency feedback-controlled audio system", *J. Acoust. Soc. Am.* 106 (2) August 199.

Gander, M. R., "Ground-Plane Acoustic Measurements of Loudspeaker Systems", *J. Audio Eng. Soc.*, 30, 10, 723-731, Oct. 1982.

* cited by examiner

*Primary Examiner*—Laura A. Grier
(74) *Attorney, Agent, or Firm*—Seth M. Reiss

(57) ABSTRACT

The present invention provides a feedback-controlled audio system. A single internal pressure-sensitive detector is used as the sensor. The primary radiator is mounted facing inward to minimize acoustical delay from the speaker. The present invention also provides a method for increasing acoustical accuracy using such an audio system.

20 Claims, 7 Drawing Sheets

LOW FREQUENCY FEEDBACK CONTROLLED AUDIO SYSTEM

RELATED APPLICATION

The present application is based on U.S. Provisional Patent Application No. 60/098,998 filed Sep. 3, 1998, the entire disclosure and contents of which is hereby incorporated by reference.

BACKGROUND OF THE INVENTION

1. Field of the Invention

The present invention relates generally to low frequency audio systems.

2. Description of the Prior Art

A number of audio systems have been patented, proposed, and sold commercially that use some form of motional feedback. Many of these systems have been created for the purpose of replacing the last bastion of the open loop in high fidelity audio systems with one that is controlled by way of a feedback system. For example, U.S. Pat. No. 5,031,221 to Yokoyama discloses a dynamic loudspeaker driving apparatus that can detect motional voltage with accuracy and then negatively feedback the detected voltage. Additionally, U.S. Pat. Nos. 4,550,430 and 3,798,374 to Meyers, show the use of motional feedback to reduce loudspeaker distortion. Another motional feedback system, described in U.S. Pat. No. 4,180,706 to Bakgaard, provides a transducer producing in the low frequency range a feedback signal proportional to the accelerations of the woofer membrane.

However, no existing system has been universally successful. That is, no system has been successful in the sense of largely replacing conventional directly-driven loudspeakers in their many configurations, including sealed box systems, ported systems, those using passive as well as active radiators, and multiple audio systems.

SUMMARY OF THE INVENTION

Therefore, it is an object of the present invention to use a sensor as the principal element of fidelity in an audio system to provide improved acoustical accuracy.

It is another object of the present invention to provide an audio system having improved acoustical accuracy using conventional loudspeaker elements.

It is yet another object of the present invention to use a woofer and passive radiator in a feedback arrangement that includes all radiating members in a single feedback loop.

It is yet another object of the present invention to provide an audio system using a sensor that not only measures all of the radiation of the system, but also provides some correction for nonlinearity arising from the finite size of the system's cabinet or other sources such as loudspeaker nonlinearity and allows feedback factors of 30 to 50 dB and unity gain crossover points of 300 to 1000 Hz.

It is therefore an object of the present invention to provide a reduction in feedback by mounting a speaker and its magnetic structure outside a speaker cabinet to allow a pressure sensor to be placed very close to the main radiating speaker.

In one aspect, the present invention provides an audio system, comprising a cabinet having an opening in a first wall thereof; a first speaker for emitting audio output, the first speaker being mounted inversely at the opening of the cabinet; and a sensor for sensing pressure caused by the audio output from the first speaker, the sensor being mounted in the cabinet by a sensor mounting structure joined to the cabinet.

An audio system, comprising a method for improving acoustical accuracy in an audio system comprising the steps of: mounting a first speaker inversely in an opening of a wall of a cabinet; sensing pressure from audio output from the first speaker; and adjusting the audio output from the first speaker based on the pressure sensed in the sensing step.

In a second aspect, the present invention provides a method for improving acoustical accuracy in an audio system comprising the steps of: mounting a first speaker inversely in an opening of a wall of a cabinet; sensing pressure from audio output from the first speaker at a position near the first speaker; and adjusting the audio output from the first speaker based on the pressure sensed in the sensing step.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Definitions

Figure 1:
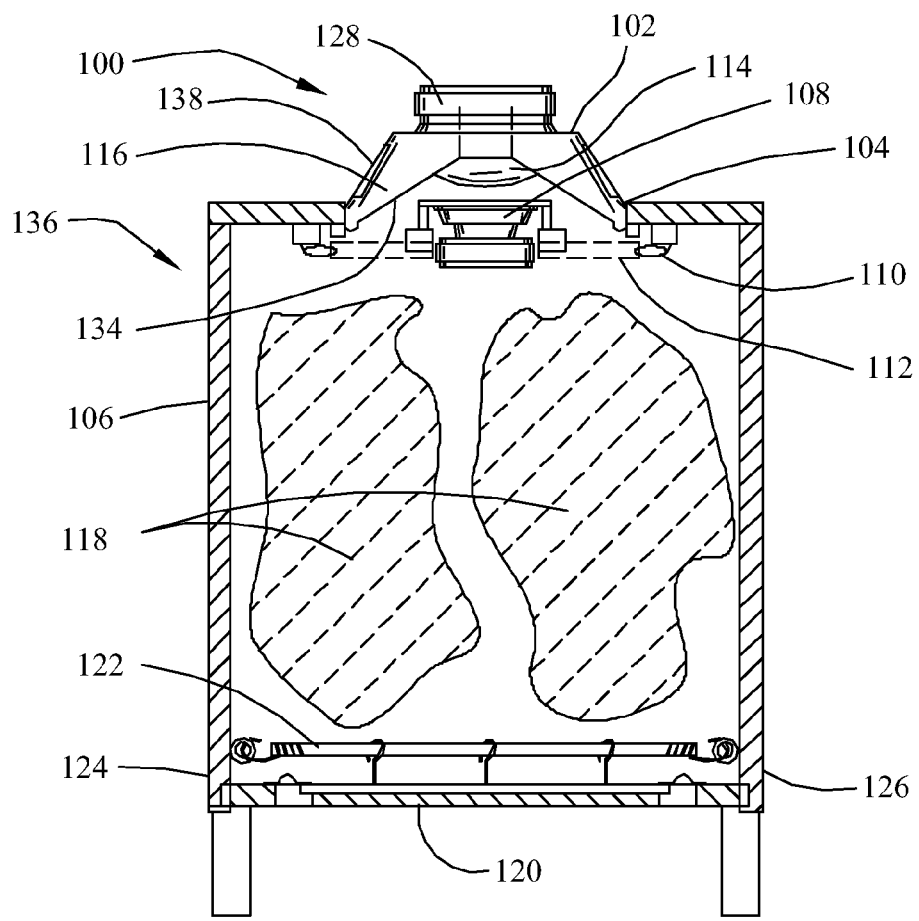
FIG. 1 is a schematic cross-sectional view of a first embodiment of an audio system of the present invention.

For the purposes of the present invention, the term "audio system" refers to any device or system incorporating a speaker such as a speaker system, public address system, stereo system, computer audio system, radio system, television system, studio system, movie theater sound system, amplified musical instrument system, electronic musical instrument, etc.

For the purposes of the present invention, the term "low frequency" refers to frequencies at or below about 200 Hz.

For the purposes of the present invention, a "conical speaker" refers to any speaker having one end larger than the other. Conical speakers include frusto-conical speakers (such as the speaker illustrated in FIGS. 1 and 2), horn-shaped speakers, etc.

For the purposes of the present invention, the term "maximum width of a conical speaker" refers to the distance across the larger end of the conical speaker.

For the purposes of the present invention, a speaker is mounted "inversely" if the end of the speaker that is larger in width is mounted facing the interior of a cabinet on which or in which the speaker is mounted. In the case of a planar speaker, in which both faces of the speaker are about the same size, the planar speaker is mounted inversely if either side faces into the cabinet on which or in which the speaker is mounted.

For the purposes of the present invention, a speaker is "mounted at" an opening of a speaker cabinet if the speaker is extends partially or entirely through an opening in the speaker cabinet or is mounted to partially or entirely cover an opening in the speaker cabinet.

For the purposes of the present invention, when referring to a location, the term "near" refers to a location no more than about 40 mm from the face of a speaker.

For the purposes of the present invention, the term "damped elastic mounting structure" refers to a mounting structure having the ability to absorb vibration that otherwise would be transmitted to a mounted device, such as a sensor or speaker.

For the purposes of the present invention, the term "elastically" refers to a flexible, shock absorbent connection, such as that afforded by a damped elastic mounting.

For the purposes of the present invention, the term "flexibly" refers to a moveable, strong, yet expandable and contractible connection, such as that afforded by a spring, bungee cord, etc.

DESCRIPTION

The present invention is a novel low frequency feedback-controlled audio system, using a single internal pressure-sensitive detector as the sensor. This system allows the use of one or more passive radiators whose contribution to the total radiation is automatically and correctly added to the sensor signal, while correcting for inherent nonlinearity of the enclosure pressure-volume relationship. The use of a solid passive radiator is important for low frequency stability and low noise. A suitable passive radiator for the purposes of the present invention is described in U.S. Pat. No. 3,821,473, the entire disclosure and contents of which is hereby incorporated by reference.

In order to place the sensor to minimize acoustical delay from the primary speaker, the primary radiator faces inward, the reverse of conventional mountings. Using the audio system of the present invention, a feedback factor of 30 to 50 dB at 15 to 300 Hz, typically the lowest frequencies is attainable with relatively straightforward networks. The system may be assembled from conventional loudspeaker elements or may incorporate advanced products as they become available.

There are several fundamental considerations that underpin the approach to the system of the present invention. First, there is a sealed enclosure, with one or more portions of the walls capable of motion or flexing. They may be loudspeaker cones, passive radiators, or even flexible walls. The limit of low frequencies, that is, the regime in which the wavelength of sound is very long compared to the dimensions of the box, must be considered.

In such a case the enclosure itself can be considered to be a "simple" sound source, and the radiation of sound will be given as follows:

$$p = \frac{\rho}{4\pi r} Q'\left(t - \frac{r}{c}\right) \quad (1)$$

where p=acoustical pressure, p=density of air, r=radial distance from source, Q=rate of change of volume element (prime denotes differentiation), t=time, and c=velocity of sound.

Assuming that the volume change is sinusoidal, the far field sound pressure may be written as:

$$p = i\omega \frac{\rho}{4\pi r} Q_0 e^{-ik(r-ct)} \quad (2)$$

Where k=ω/c, the propagation constant, ω=angular frequency (radians/sec), and $Q_0$ peak volume rate of change.

Computing the total acoustical power radiated, assuming the source is suspended in free space, the power W is $$W = 4\pi R^2 \left\langle \frac{p^2}{\rho c} \right\rangle = \frac{\rho \omega^2 Q_0^2}{8\pi c} \quad (3)$$

where <$p^2$> (average value of pressure) is (p peak)$^2$/2.

The above expression is valid for radiation into an unobstructed sphere. Using a more common assumption, radiation into a hemisphere (such as, for example, a piston in an infinite hemispherical baffle), this expression is doubled as $$W = \frac{\rho \omega^2 Q_0^2}{4\pi c} = \frac{\rho \omega^4 U_0^2}{4\pi c} \quad (4)$$

where $U_0$ is the amplitude of the volume change (not the rate of change $Q_0$). It is therefore clear that if the volume change (specifically as the inverse square of the frequency) is measured and controlled, acoustical power can be controlled independent of the source of that volume change, whether from the loudspeaker, passive radiator, or other. This suggests that the measurement of pressure in the enclosure is a good method to control the volume change, and thus the radiated power. Measurement of pressure in the enclosure as a method of evaluating the characteristics of the radiating system (e.g., a sealed or vented enclosure) is not a new idea, of course, having been observed by others and treated extensively in D. B. Keele, Jr., "Low Frequency Loudspeaker Assessment by Nearfield sound-Pressure Measurement" in *J. Audio. Eng. Soc.*, 22, 3, 154–162 (April 1974).

It is the method of this control that is part of the system of the present invention. In the low frequency range, the pressure in the enclosure, which is sealed, obeys the adiabatic PV relationship.

$$P/P_0 = (V_0/V)^\gamma \quad (5)$$

where P and $P_0$ are variable and fixed absolute pressures, respectively, V and $V_0$ are the corresponding volumes, and $\gamma$ is the ratio of specific heats at constant pressure and constant volume.

This relationship is nonlinear, so that very high power levels and/or very low frequencies can begin to introduce nonlinear distortion in the pressure/volume relationship. However, if the sensor used is also a small sealed box, with a moving element (cone or membrane) that has a suspension whose compliance is high compared to that afforded by the small air volume in the sensor enclosure and the mass of the moving element is sufficiently small, then the PV relationship in the enclosure mimics that of the larger system. That is, if the compliance of the sensor device is sufficiently large, the pressure inside the sensor enclosure for low frequencies is essentially the same as the pressure outside the sensor, which is the pressure inside the main enclosure. Then, since the two pressure relationships are the same, their relationship is as follows:

$$\frac{P}{P_0} = \left[\frac{V_0}{V}\right]^\gamma = \left[\frac{v_s}{v}\right]^\gamma \quad (6)$$

where v=variable volume of the sensor and $v_s$=fixed volume of sensor.

This leads to the relationship $$\frac{v}{v_s} = \frac{V}{V_0} \quad (7)$$

or that the sensor volume is exactly proportional to the main enclosure volume. Given that the moving element of the sensor is measured as a displacement, this implies that the motion of the sensor element accurately measures the main system volume displacement and thus the acoustical radiation.

In this system, the sensor consists of a small, high compliance, long throw woofer, mounted in a very small enclosure. The stiffness represented by the air in the small enclosure completely dominates the native stiffness of the sensor speaker, and so fulfills the conditions described above. This also places the resonant frequency of the moving element well above the primary range of interest. This resonance is also easily compensated by a pair of complex conjugate zeros in the electrical circuit, so that the sensor system can operate above its natural resonance for purposes of continuing the feedback loop to frequencies above this resonance. The result is a sensor that has the desired properties to above 1 kHz in the current design.

As can be seen from Equation 2, the direct acoustical radiation goes as the first derivative of the volume rate of change, or as the second derivative of the volume change. The pressure arising directly from the volume change, however, which is the pressure change felt in the limit of low frequencies, is proportional only to the volume change itself (neglecting nonlinearity for the moment). Assuming that the sensor is exposed to both the gross pressure changes and to that arising from the acoustical radiation of, for example, the loudspeaker, and that there are negligible acoustical reflections, the pressure will have a form similar to $$p = AU_0 - B\omega^2 U_0 \quad (8)$$

where A and B are constants and $e^{i\omega t}$ has been omitted.

The above equation predicts a result of zero at some frequency such that $A = B\omega^2$. In the actual system, several processes introduce damping, for the most part because of acoustical absorbing material in the main enclosure, but also because of damping terms in the sensor and radiator. The result is that the pressure assumes the form $$p = U_0(A - B\omega^2 + i\omega C) \quad (9)$$

where C is another constant. The values of the three constants depend upon the geometry, damping, and overall configuration of the sensor and radiators. In general the constant C can be obtained by measurement of the transfer function between input to the speaker and output to the sensor amplifier illustrated in FIG. 5, but in any case can be relatively easy to correct with a simple complex conjugate pole pair. This fact is important in obtaining constant acoustical output from the actual system. The relationship of this pressure to the overall radiation has been extensively investigated and is in general quite complex. For the purposes of the present invention, however, in the damped internal environment, the simple frequency dependence described above appears to hold, as shown in FIG. 5 below.

An audio system 100 of the present invention is represented schematically in FIG. 1. A speaker 102 is mounted in an inverse manner in an opening 104 of a speaker cabinet or speaker enclosure 106. A sensor 108 is mounted on a mounting structure 110 in a sensor enclosure 112 in speaker enclosure 106 near a driver or center portion 114 of speaker 102. Center portion 114 is surrounded by a basket or frusto-conical radiating portion 116 of speaker 102. Also mounted in speaker enclosure 106 are acoustic absorbers 118 and a passive radiator 120 suspended from a suspension system 122 mounted on cabinet walls 124 and 126. As seen generally in FIG. 1 and in detail in FIG. 2, a magnet structure 128, a frusto-conical radiating portion 116, and spider (not shown) and associated parts are located outside of speaker enclosure 106, while the a conventional radiating surface 134 faces inward. Because of the inverse arrangement of speaker 102, speaker 102 radiates into outside environment 136 from a back surface 138 of radiating portion 116. This arrangement is shown in more detail in FIG. 2.

The sensor of the present invention is preferably placed as close as possible to the driver or center region of the speaker. Preferably, the clearance is just enough to avoid mechanical interference during the maximum excursion of the speaker, preferably between about 20 and 40 mm from the center portion of the speaker bell. This close spacing reduces to a minimum the delay between a signal applied to the speaker and detection of the signal by the sensor. As a consequence, a larger feedback factor can be effected, and the open loop unity gain point can be placed higher in frequency without excessive phase shift. Preferably the sensor of the present invention is substantially smaller, i.e. has a smaller maximum width than the maximum width of the speaker it senses.

A suitable speaker for the present invention is a standard good quality 12 inch loudspeaker or woofer. A preferred loudspeaker is a SWAN® 305 Woofer. Some of the electromechanical parameters for this speaker are given in Table 1.

TABLE 1

| | |
|---|---|
| Moving mass, grams | 110.4 |
| Suspension stiffness, Newton/meter | 2246 |
| DC coil resistance, Ohms | 5.2 |
| Force constant, Newton/Amp | 14.74 |
| Mechanical Q | 9.654 |
| Xmax (max linear amplitude), mm | 7.3 |
| Effective radiating area, m$^2$ | .0531 |

A suitable sensor for the present invention is a small, high compliance woofer. A preferred sensor is a VIFA® P11 WH-00-08, a high compliance, long-throw 4.5 inch woofer. Some parameters of this loudspeaker are given in Table 2. The reason for choosing a long-throw woofer is not for its delivery power, but rather to ensure that it is very linear over the range used.

TABLE 2

| | |
|---|---|
| Moving mass, grams | 5 |
| Suspension stiffness, Newton/meter | 534 |
| DC coil resistance, Ohms | 5.4 |
| Force constant, Newton/Amp | 5.8 |
| Mechanical Q | 1.1 |
| Xmax (max linear amplitude), mm | 3 |
| Effective radiating area, m$^2$ | 0.0062 |

The enclosure for the sensor of the present invention may be created by simply sealing off all openings in the basket and the pole-piece vent, as well as adding some additional varnish to better seal the surround. Many surrounds are relatively permeable, a situation that is preferably not present in a device that is designed to respond to very low frequencies.

The mounting structure for the sensor is preferably a damped elastic one, to avoid transmitting mechanical vibrations directly to the sensor. Vibration mechanically coupled to the sensor inserts undesirable noise into the feedback system, and is preferably minimized in the audio system of the present invention. Additional damping is afforded by acoustic absorbers or filling material for the speaker cabinet. In fact, this acoustic absorbing material is important to the operation of the system, since it is very important to avoid excessive reflections from the direct acoustical radiation.

The passive radiator for the audio system of the present invention may simply be a plate of material of the proper weight, preferably one with some acoustical damping. The surround may be a standard 18" speaker surround and the suspension system may consist of two bungee cords stretched across the speaker cabinet, parallel to the plane of the passive radiator. Another way of forming a suspension system that avoids the inevitable aging of the bungee cords, is to use long coiled springs with a suitable damping cover. One of the major advantages of the audio system of the present invention is that it is not necessary for the passive radiator, speaker, and damping elements to be tuned in a way so as to produce an acoustically "flat" system. Instead, the weight and size of the passive radiator are preferably chosen to maximize the power output of the system (primarily by constraining the speaker excursion) down to its lowest rated frequency, that is, the lowest frequency for full power output. For an audio system of the present invention using the speaker of Table 1 and the sensor of Table 2, that frequency is 21 Hz and the cabinet volume is approximately 142 liters (5 cubic feet).

Choosing the most appropriate mass and area of the passive radiator makes it possible to get considerably more out of a given speaker. For the same output as that from a sealed box the speaker can have a required excursion two to three times smaller. This can be a great advantage by using a smaller, and, therefore, cheaper, magnet structure for the same efficiency, or keeping the same size magnet and increasing the efficiency two to three times by increasing the force factor. The smaller excursion has good effects in reducing doppler distortion for the higher frequencies the speaker may be carrying.

In the configuration of the audio system of the present invention such as that shown in FIG. 1, with a passive radiator on the bottom and woofer on top, it is desirable for convenience in combining the low frequency radiator with a mid- and high-frequency portion. Placing the woofer (which is the dominant radiator at the woofer/midrange crossover point) at the top of the cabinet puts it in the closest possible proximity to the mid-range speaker. This makes for a much cleaner crossover, i.e. a better crossover. Legs or other devices may be used to raise the passive radiator off the floor.

The present invention allows new advances in speaker design, namely, the current use of rigid cones could be curtailed. Currently, the cone must behave much like a piston pumping air so that it tracks the motion of the motor coil, the object being measured by the sensor. Cones are made as rigid as possible and perform acceptably up to a point but fail at some frequency. To prevent this break point the cone (or perhaps even another shape) could be made smooth yet flexible, so that it would damp out the material waves in the radiator. This would keep down acoustical delay to the sensor at high frequencies (around 500 Hz and above), and facilitate feedback gain-crossover. This application has been investigated in soft dome tweeters, but has not been widely applied to the low frequency woofers.

In addition to the sound quality, other advantages of the audio system of the present invention are apparent. First, it is a generally axial arrangement, making it easy to merge with a system designed to approximate a radiating tower. Second, it causes the reaction forces from the rather heavy passive radiator to be vertical, substantially reducing the cabinet vibration that would be present were the passive radiator placed on the side of the enclosure.

Figure 3:
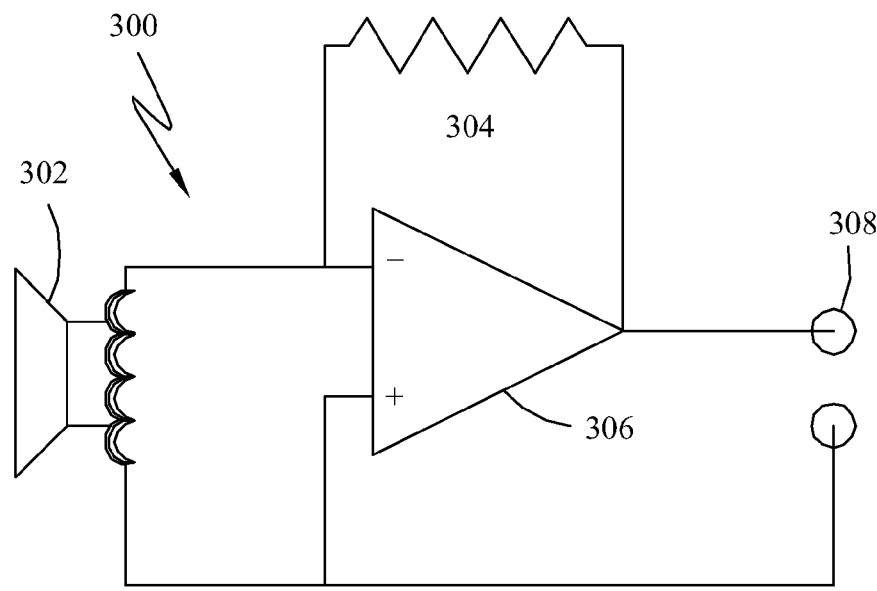
FIG. 3 is a schematic showing of a sensor and preamplifier of the present invention.

To take maximum advantage of the potentially very low noise of the sensor, the output coil is fed into a low input impedance transimpedance amplifier. A single ended version of this amplifier is shown in schematic form in FIG. 3. Amplifier 300 comprises a sensor 302, a resistor 304, a preamplifier 306, and an output 308. Preferably a balanced version of this amplifier used, reducing the stray noise pickup such as AC hum. This arrangement gives the sensor a high signal-to-noise ratio, preferably of 100 dB or greater.

Figure 4:
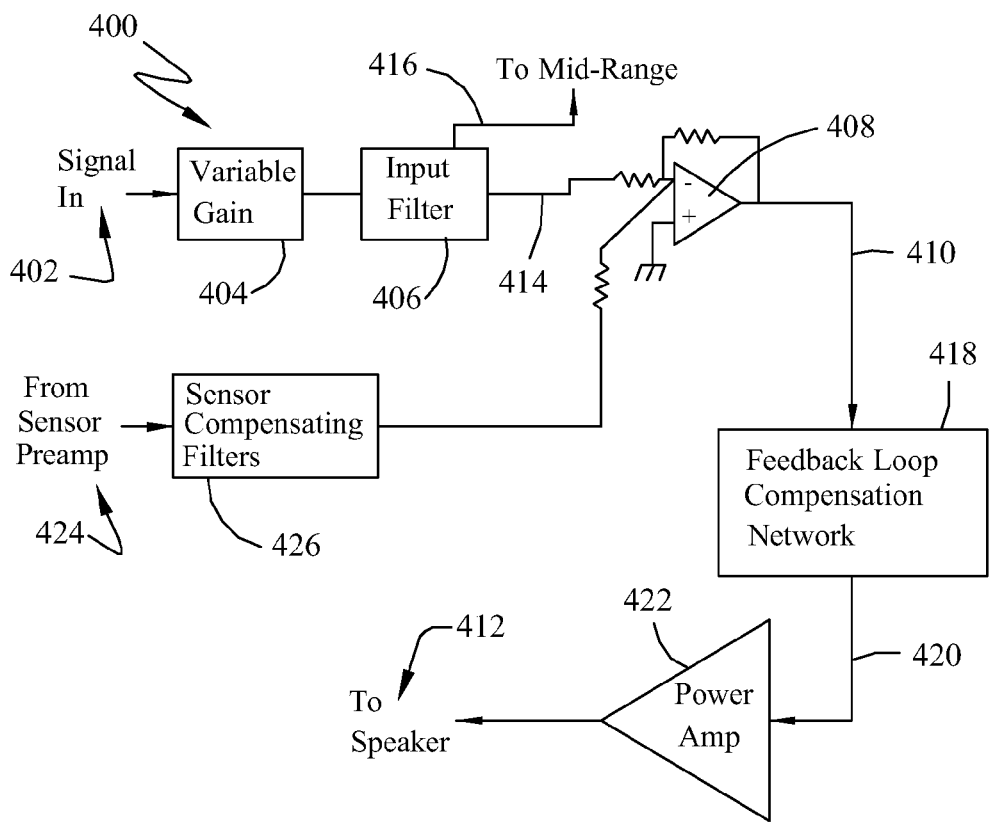
FIG. 4 is a block diagram and schematic illustration of an audio system of the present invention.

The operation of the audio system of the present invention is shown schematically in FIG. 4. The overall operation is as follows: an input signal 402 passes through a variable gain stage 404 and an input filter stage 406. The purpose of both of these stages is to avoid the application of excessive signals to the feedback system, which by its nature will drive the system to destruction if the signal so demands. In particular, the filter preferably contains a very sharp ($8^{th}$ order maximally flat) low frequency cutoff to avoid the introduction of subsonic signals that, because of the very high feedback factor, are capable of driving the loudspeaker to excessive excursions. A variable gain amplifier 408 is activated only if an output signal 410 to a speaker 412 exceeds safe values, at which point variable gain amplifier 408 reduces input signal 414 temporarily. Variable gain amplifier 408 thus acts as a limiter. Input filter stage 406 also has a crossover network 416 to mid- and high-frequency portions of the system (not shown). All filters used in the embodiment shown in FIG. 4 are preferably active analog filters. However, digital filters may also be used in the audio system of the present invention.

After amplification, output signal 410 is conditioned by a feedback loop compensation network 418 to provide the appropriate frequency response for a feedback loop (not shown) of the audio system. The action of feedback loop compensation network 418 is discussed in more detail below. An output 420 of Feedback Loop Compensation Network 418 is then fed to a power amplifier 422 for driving speaker 412. A signal from a sensor preamp 424 is modified by a sensor compensating filter 426 to produce a frequency/gain dependence such as the one shown in FIGS. 8, 9, and 10.

The output of the sensor is conditioned electronically in several ways. In the first place, there is a complex conjugate zero pair that corrects for the natural resonance of the sensor, as discussed above. There is also a complex conjugate pole pair to correct for the mixing of the gross pressure changes with the direct acoustical radiation, resulting in the behavior shown in Equation 9 above.

Finally, it is desirable to correct the final output so that the signal is proportional to acoustical intensity. As can be seen from Equation 4 above, this implies that the signal be proportional to the volume displacement times the frequency squared, or twice differentiated. One derivative occurs automatically since the sensor coil responds to velocity, not displacement. It is only necessary to insert a single zero below the frequency range of interest to produce the proper signal. A (linearized) response $E_s$ of the sensor is given to a good approximation by $$E_s = \frac{i\omega p\eta a\kappa g}{1 - (\omega/\omega_0)^2 + i\omega/(\omega_0 Q_s)} \quad (10)$$

Where $\eta$=overall compliance of the sensor element including enclosure, a=area of sensor moving element, $\kappa$=sensor force constant, g=gain of sensor preamplifier, $Q_S$="Q" of sensor assembly, $\omega_0$=resonant frequency of sensor assembly, and p=differential pressure incident on sensor.

The incident pressure is given by Equation 9 above. Substitution of this expression yields:

$$E_s = \frac{i\omega U_0 a\eta\kappa g(A - B\omega^2 + iC\omega)}{1 - (\omega/\omega_0)^2 + i\omega/(\omega_0 Q_s)} \quad (11)$$

This signal is corrected with the network, given by $$N_s = \frac{\{1 + i\omega/\omega_L\}\{1 - (\omega/\omega_0)^2 + i\omega/(\omega_0 Q_s)\}}{A - B\omega^2 + iC\omega} \quad (12)$$

where $\omega_L$=a frequency well below the acoustical range of interest.

The product $E_C$ of $N_S$ and $E_S$ is then given by $$E_c = i\omega U_0 a\eta\kappa g(1 + i\omega/\omega_1) \quad (13)$$

that becomes, for $\omega \gg \omega_L$ $$E_c \approx -\omega^2 U_0 a \eta\kappa g/\omega_1 \quad (14)$$

which is the necessary condition for the signal to represent accurately the radiated power.

The constants A, B, C, as well as the constants in the sensor resonance equation, Equation 5 above, may be determined by measurement, although good approximations can be obtained by careful modeling. The preferred sensor network is realized with active filters. Such filters are stable and relatively simple.

The feedback loop compensation network of the present invention primarily determines the stability and the performance of the feedback loop. It is selected to bring the gain to unity at low frequencies and at high frequencies with reasonable phase margins and with a large open loop gain in the center of the range. The overall loop gain includes the transfer function between the acoustical radiating elements and the sensor. This is difficult to model over the entire frequency range and in practice has been determined by direct measurement. With this function in hand, however, the rest of the network design, although complex, is relatively straightforward. For a typical open loop gain, see FIG. 8.

In a preferred embodiment of the present invention, the resonant frequency of the sensor is around 275 Hz and the apparent "zero" caused by the interference between the gross cabinet pressure and the acoustical radiation is around 65 Hz. These can be seen in FIG. 5. To make a reasonably comfortable feedback loop it requires around 20 poles and zeros, not counting the sensor correcting network or the input filters.

A preferred audio system of the present invention puts out approximately 450 milliwatts of acoustical power throughout its range, assuming radiation into a hemisphere. This results in about 900 milliwatts into a quadrant of a sphere, a better approximation to a large room. Its low point is 21 Hz, and its high point is determined, of course, by the crossover to the midrange system. In order to supply this much acoustical power approximately 150 watts of electrical output power is required at the most efficient point.

An important consideration in the audio system of the present invention is the stability of the loop. In particular, the gain at high frequencies is preferably brought to unity gain and below before the phase shift has equaled 180 degrees, and preferably considerably less than that. The high frequency phase shift comes partly from the gain slope, and partly from the non-minimal phase portion, the delay. The physical proximity of the sensor addresses the high frequency, the low frequency unity gain point is treated separately.

Since the transfer function at low frequencies between radiation and sensor is primarily determined by the gross pressure changes in the enclosure, it is important that this be reasonably well behaved. The pressure/displacement relationship is well behaved for a sealed box, the pressure being simply proportional to the displacement. In the embodiment illustrated in FIG. 1, the audio system of the present invention uses a passive radiator that, although sealed, has a finite compliance by way of the suspension. Therefore at sufficiently low frequencies the pressure/displacement relationship is still proportional, although the proportionality constant is different, determined primarily by the area of the passive radiator and its suspension compliance. Under these circumstances it is easy to effect a stable unity gain crossover.

Were the passive radiator an open vent, as in a normal "bass reflex" cabinet, this relationship would not be so simple, and the transfer function would fall off much more rapidly at very low frequencies. In fact, at frequencies below the Helmholtz resonance the pressure drops as the square of the frequency for fixed excursion of the speaker, making the velocity fall as the third power. This makes the achievement of a good gain crossover very difficult, if not impossible, without the introduction of significant low frequency noise because of the very large gains needed at low frequencies. This approach can result extremely poor performance. Therefore the audio system of the present invention preferably uses a solid passive radiator that is sealed and suspended with a relatively stable compliance.

There are other arrangements of the audio system of the present invention that may be used to approximate the results described above, assuming the use of a solid passive radiator instead of a vent. For example, accelerometers may be placed on the passive radiator and speaker, or a moving coil sensor maybe used on one or both, assuming the passive radiator is equipped with a magnet structure and coil. This approach is described in U.S. Pat. No. 3,821,473 to Mullins and an approximate combination of sensors on these two elements may accomplish the same purpose as the sealed-box moving-coil sensor described above. This implies that the main radiator and passive radiator are acting essentially as pistons, or at least with electronically correctable deviations from piston behavior. The method described for the present invention requires no such assumption.

Figure 12:
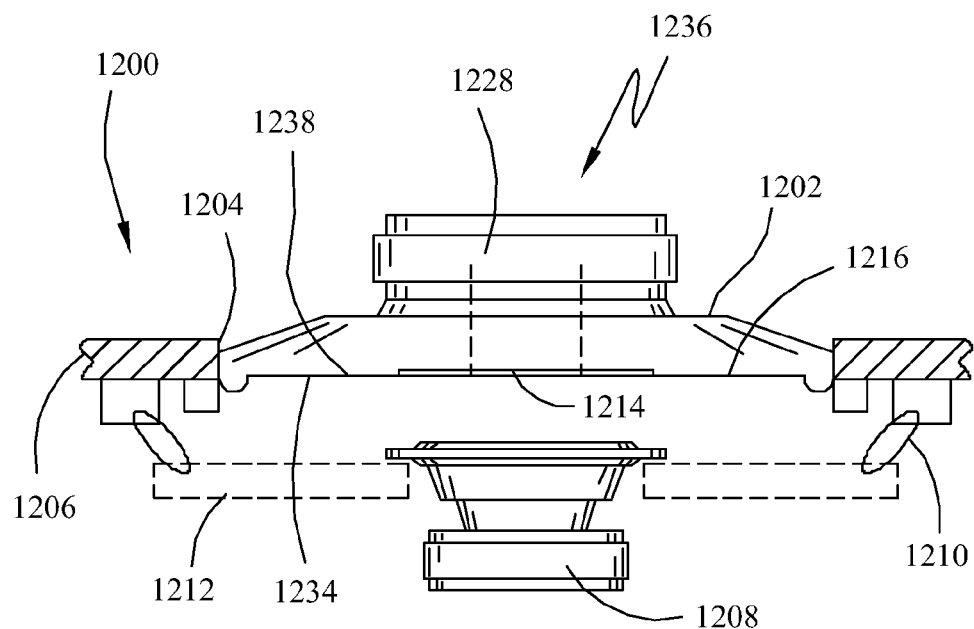
FIG. 12 is an enlarged schematic cross-sectional view of second embodiment of the audio system of the present invention.

FIG. 12 illustrates an audio system 1200, having an electrodynamic planar speaker 1202 mounted in an inverse manner in an opening 1204 of a speaker cabinet or speaker enclosure 1206 (only partially shown). A sensor 1208 is mounted on a mounting structure 1210 in a sensor enclosure 1212 in speaker enclosure 1206 near a center portion 1214 of electrodynamic planar speaker 1202. Center portion 1214 is surrounded by a radiating portion 1216 of electrodynamic planar speaker 1202. Also mounted in cabinet 1206 are acoustic absorbers (not shown) mounted similarly to the acoustic absorbers in the embodiment of FIGS. 1 and 2. A magnet structure 1228 and radiating portion 1216 are located outside of speaker enclosure 1206, while a conventional radiating surface 1234 faces inward. Because of the inverse arrangement of electrodynamic planar speaker 1202, electrodynamic planar speaker 1202 radiates into outside environment 1236 from a back surface 1238 of radiating portion 1216.

The electrodynamic planar speaker of the embodiment shown in FIG. 12 may be any suitable conventional electrodynamic planar speaker. Preferably the electrodynamic planar speaker is designed to have an effective radiating diameter that decreases as a function of frequency. That is, the speaker is caused through the use of flexible and highly damped material to have a shrinking radiating diameter as the frequency of the speaker rises which is corrected by the feedback system of the audio system of the present invention. A major advantage of such a speaker system is that because of the shrinking diameter, the acoustical delay decreases as the frequency rises, allowing larger feedback at higher frequencies and a higher frequency gain crossover point.

Figure 13:
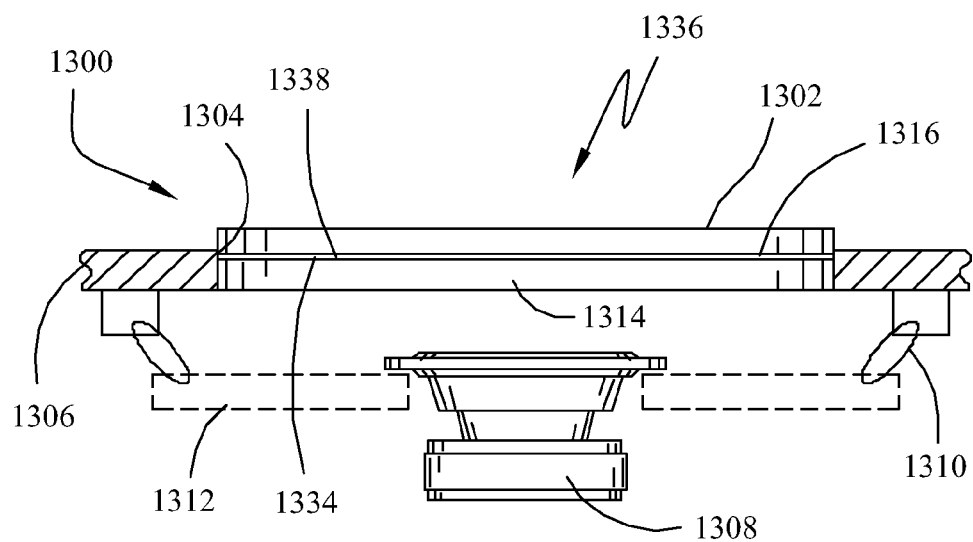
FIG. 13 is an enlarged schematic cross-sectional view of a third embodiment of the audio system of the present invention.

FIG. 13 illustrates an audio system 1300, having an electrostatic planar speaker 1302 mounted in an inverse manner in an opening 1304 of a speaker cabinet or speaker enclosure 1306 (only partially shown). A sensor 1308 is mounted on a mounting structure 1310 in a sensor enclosure 1312 in speaker enclosure 1306 near a center portion 1314 of electrostatic planar speaker 1302. Center portion 1314 is part of a membrane or radiating portion 1316 of electrostatic planar speaker 1302. Also mounted in cabinet 1306 are acoustic absorbers (not shown) mounted similarly to the acoustic absorbers in the embodiment of FIGS. 1 and 2. A conventional radiating surface 1334 faces inward. Because of the inverse arrangement of electrostatic planar speaker 1302, electrostatic planar speaker 1302 radiates into outside environment 1336 from a back surface 1338 of radiating portion 1316.

The electrostatic planar speaker of the embodiment shown in FIG. 13 may be any suitable conventional electrostatic planar speaker. Preferably the electrostatic planar speaker is designed to have an effective radiating diameter that decreases as a function of frequency. That is, the speaker is caused through the use of a deliberately frequency dependent active area to have a shrinking radiating diameter as the frequency of the speaker rises which is corrected by the feedback system of the audio system of the present invention. A major advantage of such a speaker system is that because of the shrinking diameter, the acoustical delay decreases as the frequency rises, allowing larger feedback at higher frequencies and a higher frequency gain crossover point. Also, the use of a passive radiator for an electrostatic planar speaker greatly reduces the required membrane excursion at the lowest frequency for the speaker. This helps to overcome one of the primary disadvantages of electrostatic speakers at low frequencies: insufficient excursion. An electrostatic planar speaker used in the present invention is preferably symmetric, that is, it preferably radiates from both sides.

Figure 2:
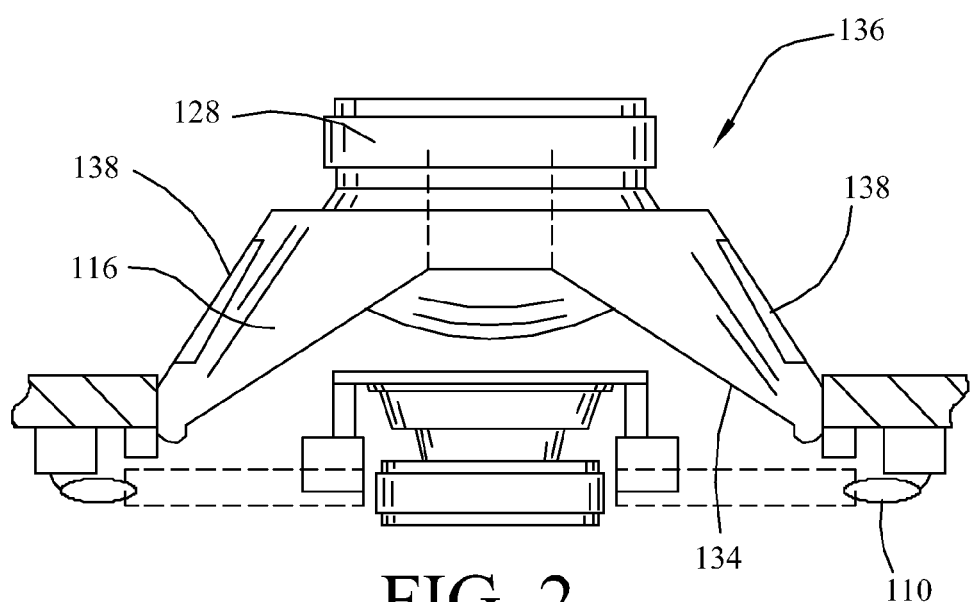
FIG. 2 is an enlarged schematic cross-sectional view of one end the embodiment of FIG. 1.

As in the embodiment shown in FIGS. 1 and 2, in the embodiments shown in FIGS. 12 and 13, the sensor of the present invention is preferably placed as close as possible to the driver or center region of the speaker. Preferably, the clearance is just enough to avoid mechanical interference during the maximum excursion of the speaker, preferably between about 20 and 40 mm from the center portion of the speaker bell. This close spacing reduces to a minimum the delay between a signal applied to the speaker and detection of the signal by the sensor. As a consequence, a larger feedback factor can be effected, and the open loop unity gain point can be placed higher in frequency without excessive phase shift. Preferably the sensor of the present invention is substantially smaller, i.e. has a smaller maximum width than the maximum width of the speaker it senses.

As can be seen from the embodiments illustrated in FIGS. 1, 2, 12 and 13, the speakers which may be used in the audio system of the present invention may have various sizes and shapes. For example, although not shown, the audio system of the present invention may be used with a conventional horn-shaped speaker. With a horn-shaped speaker, the sensor is preferably be placed deep in the throat of the horn of the speaker and a second sensor is used to respond to speaker cabinet pressure. Alternatively, a two-sided horn configuration may be used in which a two-sided horn speaker drives both the horn and the speaker enclosure.

The present invention will now be described by way of example.

EXAMPLE

In order to test the various aspects of the audio system shown in FIG. 1, a set of two such systems have been constructed. Since it is difficult to do subjective tests as well as quantitative ones with a single low-frequency system or even a pair of them, a high frequency component was added to each. This high frequency component was a DYNAUDIO® GEMINI® kit, which is designed as a full range system using two small high quality woofers and vents along with an excellent tweeter. This high frequency component appeared to be able to handle the full power level for which the low frequency system is designed, although not at the lower end of its range. However, the electronic crossover employed rolls off the GEMINI® at lower frequencies, so this is not a problem.

Figure 5:
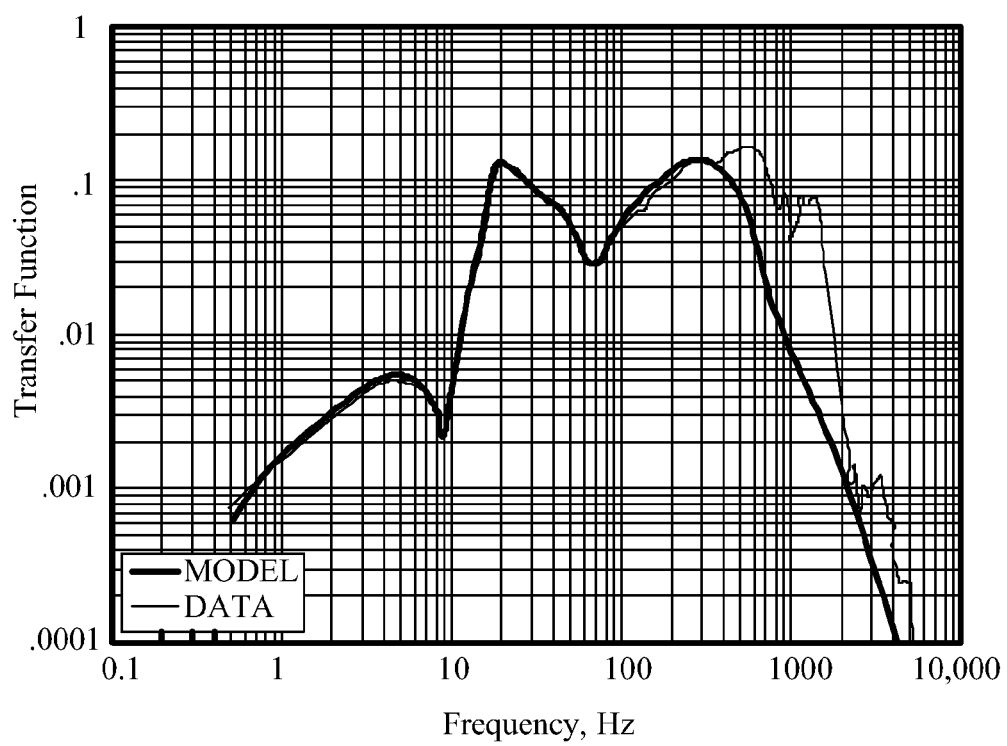
FIG. 5 is a graph showing woofer-sensor transfer function for two audio systems of the present invention.

The transfer function for the two tested systems are shown in FIG. 5. Two results are plotted there: the measured values, and the values predicted by the model. The model is essentially a "lumped constant" one with the direct radiation component added. In order to obtain the fit shown, the attenuation coefficient of the absorbing material in the box was adjusted empirically, and some adjustment had to be made to the radiation coefficient of the speaker. It was also necessary to adjust the compliance and damping of the passive radiator empirically, since no accurate objective measurements were made. Masses of speaker and passive radiator, all speaker parameters, enclosure volume, and sensor parameters were measured independently.

The measurements of the sensor were carried out at the output of the sensor preamplifier, which is a very low noise device with an effective input impedance of zero and a transimpedance of 100 ohms. All measurements, including the acoustical ones described below, were carried out at a relatively high power level, with a fixed 25 volts peak across the main speaker.

These measurements show a relatively good fit except at the highest frequencies. Since the model did not take into account either speaker cone mode breakup or box resonances, it is not surprising that the measurements and model disagree at high frequencies. For the most part, however, these deviations are at frequencies well outside the designed range of the woofer system.

From a practical point of view, whether or not the model and measurements agree is unimportant, since only the measured values are used in the design of the feedback system. However, the agreement adds some confidence that we are dealing with behavior that is reasonably well understood.

Principal features of this behavior are seen in the dip at approximately 9 Hz, which is caused by the resonance of the mass of the passive radiator with its suspension, and the dip at approximately 65 Hz. The latter is the result of the interference between the volume pressure changes and the acoustical radiation described in the foregoing.

In order to verify the basic elements of the system and to get some data for the design of the crossover network, acoustical measurements have been in both the low frequency system and the GEMINI® system. Because the primary interest was in the low frequency range of the speaker, the measurements were conducted in the open.

Since the goal was to measure the system in a way that would allow predictions of behavior in a fixed (albeit hypothetical) environment of radiation into a hemisphere, a ground plane technique was used. A sheet of plywood was placed in an open, paved area, with no structures close enough to cause problems with reflections, to create a hard, smooth, reflecting surface. Placed on this sheet were a microphone and a speaker assembly, with a speaker placed so that the radiating area was as close as possible to the plywood sheet. In the case of the woofer this necessitated placing the system on its side.

Figure 6:
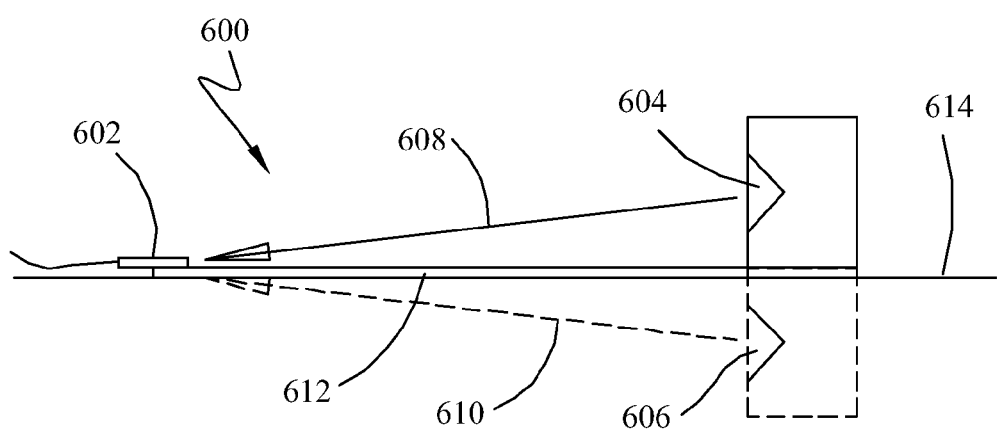
FIG. 6 is a schematic drawing of an arrangement for measuring the acoustics of an audio system of the present invention.

This arrangement is shown schematically in FIG. 6. As can be seen, assuming the reflecting surface is flat and perfectly reflective, the distance from the microphone 602 to a source 604 is nearly the same as the distance from microphone 602 to an image 606 of source 604. Therefore they add in phase, giving a result that, except for a small correction that amounts to increased radial distances RS 608 and RI 610 in the FIG. 6, the measurements are those that would be obtained for the idealized hemisphere. The primary deviation to be expected is the misalignment of microphone 602 from the ideal plane represented by a plywood sheet 612 and ground 614. In the present case the geometry indicates that this would occur only for frequencies near the upper end, above 15 kHz. The use of such ground-plane acoustical measurements has been investigated extensively by M. R. Gander in "Ground-Plane Acoustic Measurements of Loudspeaker Systems", *J. Audio Eng. Soc.*, 30, 10, 723–731 (October 1982) and although it is not convenient, for obvious reasons, as the internal environment provided by an anechoic chamber, the low frequency measurements can often be much better.

It must be recognized that the equivalence of ground plane and idealized hemisphere radiation is strictly true only for the low frequencies, since at higher frequencies one cannot avoid the effect of the geometry of the speaker enclosures, as compared to an infinite wall. However it is free of low-frequency anomalies. All measurements discussed below are based on the ground plane technique. As usual, in a normal room the actual response of the system will be considerably stronger in the bass than shown by these results. These are referred to as "pseudo" hemisphere quantities.

Figure 7:
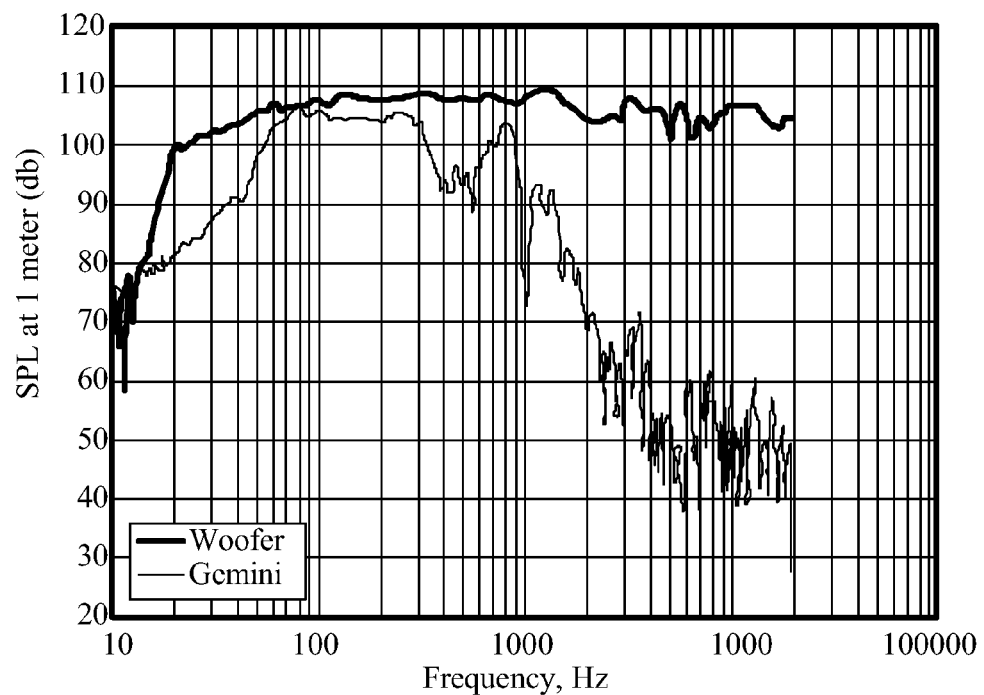
FIG. 7 is a graph showing open loop acoustic measurements obtained using the arrangement of FIG. 6.

Measurements of one of the woofer systems of the present invention and one of the Gemini® systems are shown in FIG. 7. These are open loop measurements, with the same 25 volts peak driving the audio system. To maintain a comparable normalization, all acoustical data are expressed as dB, in this case SPL at one meter with the 25 volts peak drive.

The microphone used in the measurements was a B&K 4190 "FALCON® series" with a 2669 amplifier. The frequency flatness should be better than +/−0.25 dB. All measurements were performed using an Ariel Corporation SYSid system.

The feedback loop correcting network and the network that connects the sensor output discussed in the foregoing were designed using the actual measurements rather than the model. All were active filters, since the complexity of this design makes the use of active filters preferable. This extends to the crossover network as well, since separate power amplifiers, all contained within the same housing, are used for all four components. This makes it relatively easy to configure a superior crossover network.

Figure 8:
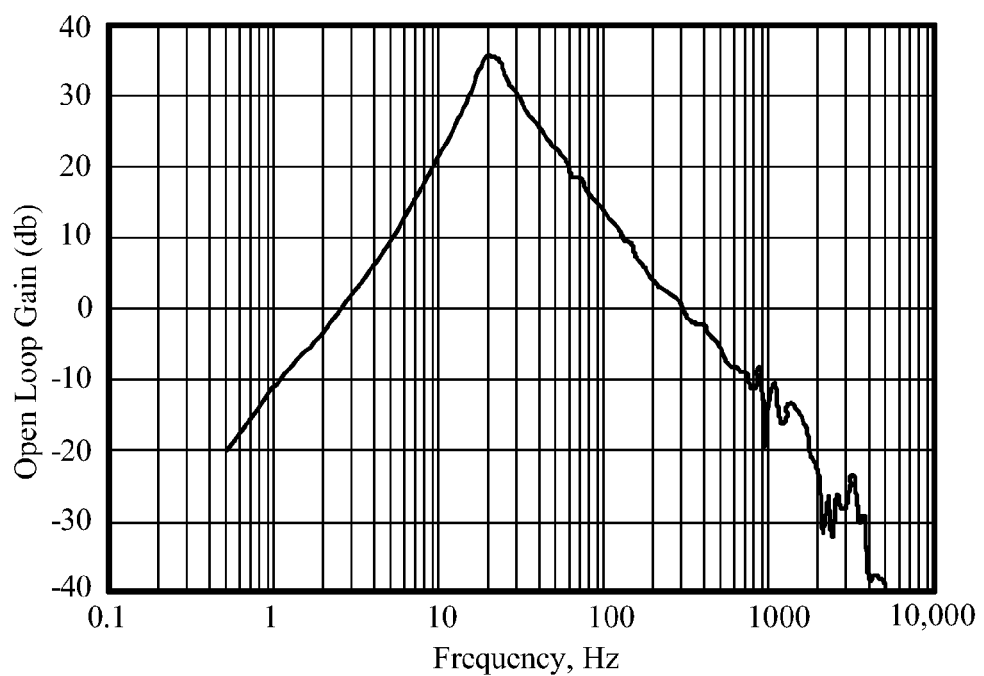
FIG. 8 is graph showing typical open loop gain for an audio system of the present invention.
Figure 9:
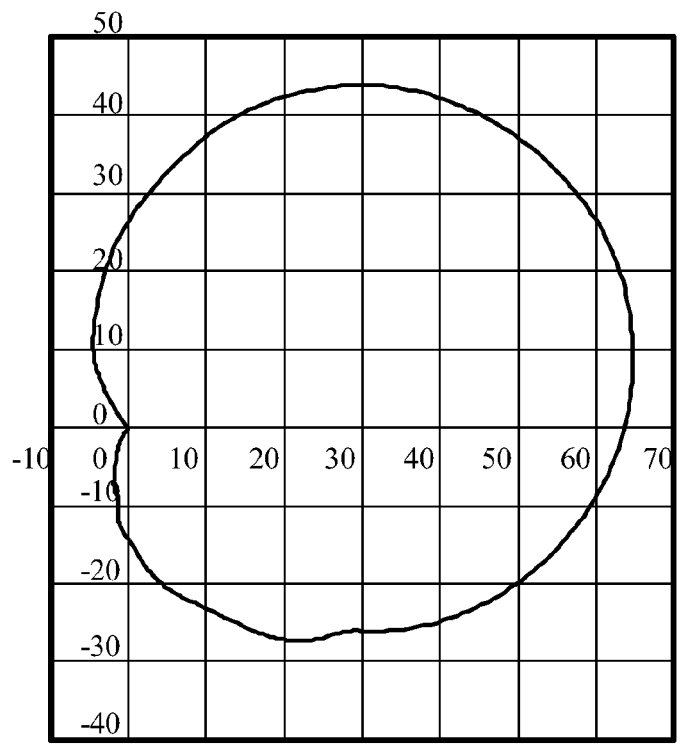
FIG. 9 is a graph showing a Nyquist plot for an audio system of the present invention.

A typical open loop gain is shown in FIG. 8, with the corresponding Nyquist plot in FIG. 9. The peak open loop gain is about 35 dB, and it occurs near the low end of the design range, where the driver and passive radiators have the greatest amplitude. A greater gain here could easily be achieved, but it is not necessary and only complicates the task of obtaining good phase and gain margins at the high-frequency gain crossover points.

Figure 10:
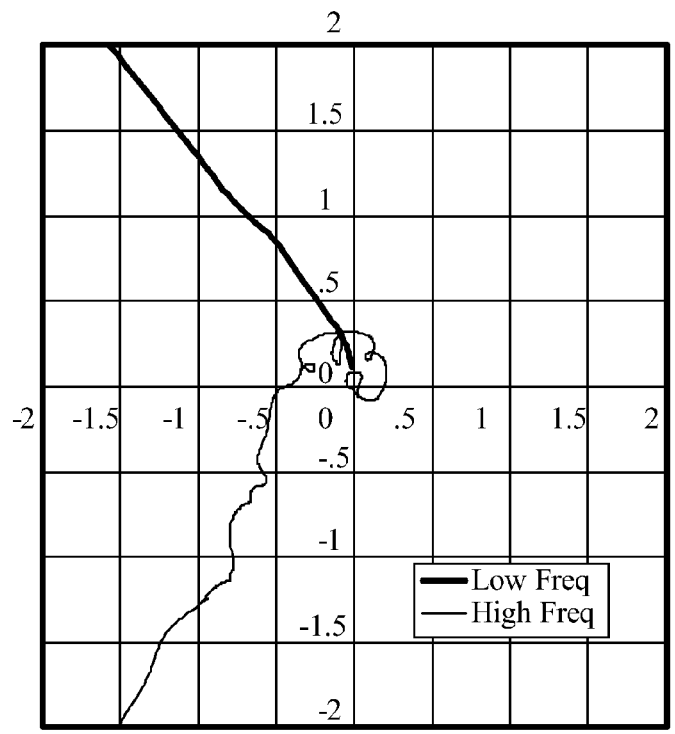
FIG. 10 is a graph showing gain crossover details of the Nyquist plot of FIG. 9.

The details of the gain near the unity gain points at high and low frequency are shown in FIG. 10. As can be seen, the phase margins are excellent at low frequency, somewhat less so at high frequency (note the critical point at minus 1 on the horizontal axis). The reason, of course, is primarily because of the acoustical delay, which is negligible at low frequency but which becomes a significant factor at high frequencies.

This uses a network of about 20 poles and zeros. In operation the system is extremely stable and well behaved. The low frequency cutoff and variable gain input amplifier are effective in preventing the system from being overdriven, which could easily happen with an unrestricted input.

Figure 11:
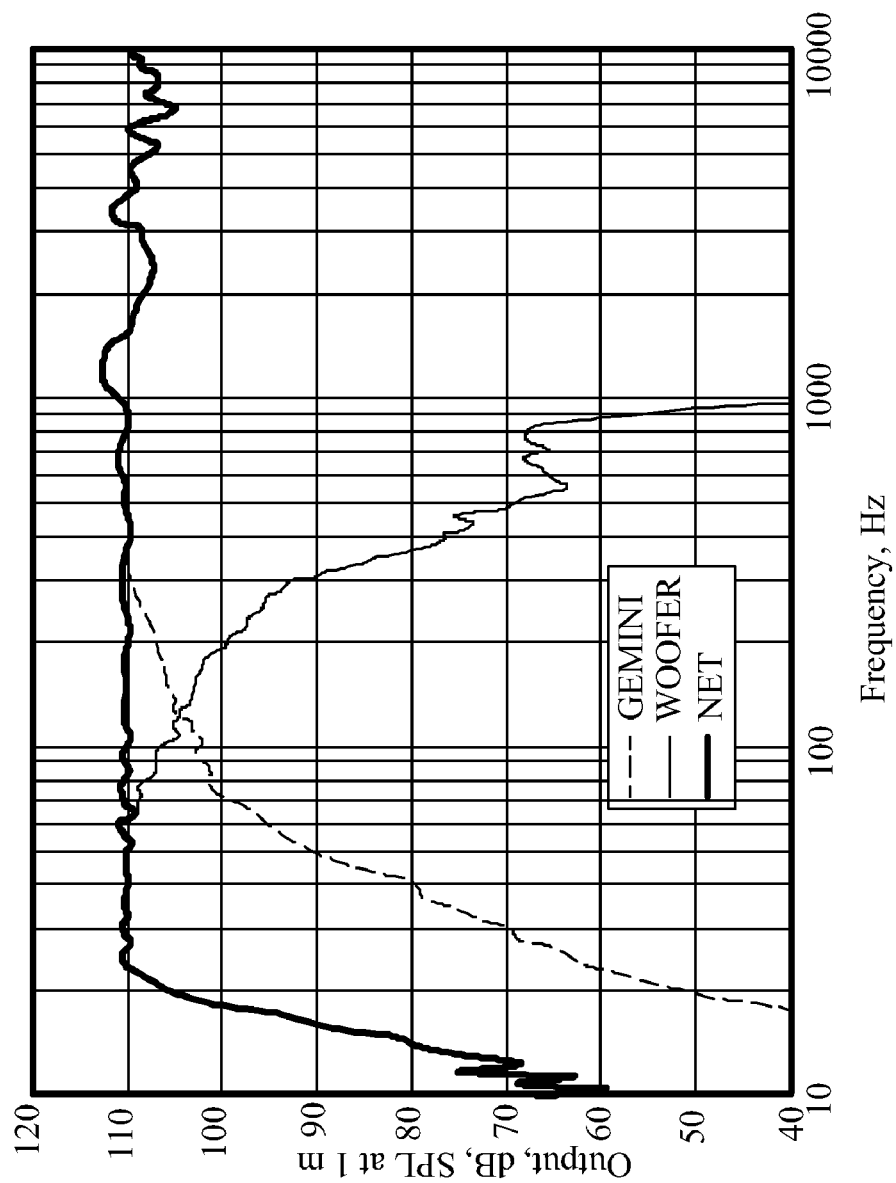
FIG. 11 is a graph showing acoustical output of an audio system of the present invention.

The closed-loop output of the woofer and the open-loop output of the midrange/tweeter system have been used to design a crossover system for the two. The data shown in FIG. 11 are from acoustical measurements modified by the feedback. A small correction has been applied to account for the fact that the passive radiators (in the GEMINI® case, a vent) are displaced somewhat from the main radiator, and thus add somewhat differently at different locations. The corrections are actually quite small, but for completeness they have been applied so that the data in FIG. 11 are correct for a distance of 3 meters from the main radiator of the woofer and at the same height, approximately 0.76 meters.

The absolute value of the output, however, is normalized to SPL at one meter, at maximum designed output power of the system, radiating into the "pseudo" hemisphere. The measurements from which these data were derived were taken at an altitude of approximately 6250 feet (1905 m) and a temperature of 73 degrees F. The atmospheric pressure was approximately 603 mm Hg. At sea level the output power would be appropriately greater.

The crossover network is relatively simple compared to the feedback correcting networks. The high frequency portion consists of a single first order low frequency roll-off (the GEMINI® system). The woofer crossover is more complex, with a first order high frequency rolloff, a single complex conjugate zero and three complex conjugate pole sets. The GEMINI® crossover may also be accomplished with passive elements, but it was very simple to do it with active elements.

The use of a passive radiator in a particularly cheap and simple form makes possible the production of very low frequencies at high power, well beyond the capability of the loudspeaker in a simple sealed box alignment. The use of the large feedback and accurate sensor also allows a user of the audio system of the present invention to drive the loudspeaker well beyond its normal linear range and still maintain high acoustical accuracy and low distortion, at even higher power.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An audio system, comprising:
 a cabinet;
 an active radiator sealed within a first opening of a wall of said cabinet for emitting acoustic radiation symmetrically inward into said cabinet and outward into the environment outside of said cabinet;

at least one passive radiator sealed within a second opening of a wall of said cabinet for emitting acoustic radiation symmetrically inward into said cabinet and outward into the environment outside of said cabinet in response to radiation generated by said active radiator;

an acoustic sensor suspended within said cabinet in close proximity to said active radiator for sensing total acoustic radiation generated by both said active and said passive radiators;

a closed loop circuit connecting said acoustic sensor with said active radiator.

2. The audio system of claim 1, wherein the active radiator and passive radiator are sealed within first and second openings in different walls of said cabinet.

3. The audio system of claim 1, wherein the passive radiator is sealed in a cabinet wall opposite the cabinet wall in which the active radiator is sealed.

4. The audio system of claim 1, comprising a plurality of passive radiators sealed within different cabinet walls.

5. The audio system of claim 1, wherein said closed loop circuit further comprises a means for adjusting the audio output of said active radiator based on the total acoustic radiation sensed by said acoustic sensor.

6. The audio system of claim 5, wherein said means is a servo system.

7. The audio system of claim 1, wherein the said closed loop circuit further comprises a feedback control system that corrects the signal sent to the active radiator such that total acoustic radiation sensed approaches said input signal.

8. The audio system of claim 1, wherein the said closed loop circuit further comprises a feedback control system that corrects the signal sent to the active radiator such that the audio output behaves independent of audio frequency.

9. The audio system of claim 1, wherein said active radiator is a speaker mounted inversely into said first opening.

10. The audio system of claim 1, wherein said active radiator is a horn-shaped speaker, a first acoustic sensor is suspended within the throat of said horn-shaped speaker to sense primarily high frequency radiation emitted by said speaker, and a second acoustic sensor is suspended within said cabinet between said active and passive radiator to sense total acoustic radiation.

11. The audio system of claim 1, wherein said acoustic sensor is a speaker.

12. The audio system of claim 1, wherein said acoustic sensor is suspended in said cabinet by means of a damped elastic mounting structure.

13. The audio system of claim 1, wherein said active radiator comprises an electrodynamic planar speaker.

14. The audio system of claim 1, wherein said active radiator comprises an electrostatic planar speaker.

15. The audio system of claim 1, further comprising acoustic absorbing material contained in said cabinet.

16. The audio system of claim 1, wherein said passive radiator comprises a solid surface sealed and suspended within said second opening.

17. The audio system of claim 1, wherein said passive radiator comprises a flexible cabinet wall.

18. A method for improving acoustical accuracy in an audio system comprising the steps of:

sealing an active radiator within a first opening in a wall of a cabinet, said active radiator being capable of emitting radiation symmetrically inward into said cabinet and outward into the environment outside said cabinet;

sealing a passive radiator within a second opening in a wall of said cabinet, said passive radiator being capable of emitting radiation symmetrically inward into said cabinet and outward into the environment outside said cabinet in response to radiation generated by said active radiator;

suspending an acoustic sensor within said cabinet in close proximity to said active radiator; and adjusting the audio output from the first speaker based on total acoustic radiation sensed by said acoustic sensor through a closed-loop feedback control system connecting said acoustic sensor to said active radiator.

19. The method of claim 18, wherein the passive radiator is sealed in a cabinet wall opposite the cabinet wall in which the active radiator is sealed.

20. The method of claim 18, wherein said closed-loop feedback control system corrects the signal sent to the active radiator such that total acoustic radiation sensed approaches said input signal and the audio output behaves independent of audio frequency.

* * * * *